(12) United States Patent
Krishnan et al.

(10) Patent No.: US 11,248,295 B2
(45) Date of Patent: Feb. 15, 2022

(54) WAFER CARRIER HAVING RETENTION POCKETS WITH COMPOUND RADII FOR CHEMICAL VAPOR DEPOSITION SYSTEMS

(71) Applicant: Veeco Instruments Inc., Plainview, NY (US)

(72) Inventors: Sandeep Krishnan, Jersey City, NJ (US); Lukas Urban, Boulder, CO (US)

(73) Assignee: Veeco Instruments Inc., Plainview, NY (US)

( * ) Notice: Subject to any disclaimer, the term of this patent is extended or adjusted under 35 U.S.C. 154(b) by 0 days.

(21) Appl. No.: 16/205,613

(22) Filed: Nov. 30, 2018

(65) Prior Publication Data

US 2019/0169745 A1   Jun. 6, 2019

Related U.S. Application Data

(62) Division of application No. 14/605,497, filed on Jan. 26, 2015, now Pat. No. 10,145,013.

(Continued)

(51) Int. Cl.
*C23C 16/458* (2006.01)
*C30B 25/12* (2006.01)

(52) U.S. Cl.
CPC ........ *C23C 16/4584* (2013.01); *C23C 16/458* (2013.01); *C30B 25/12* (2013.01); *Y10T 29/49* (2015.01)

(58) Field of Classification Search
CPC ... C23C 16/4584; C23C 16/458; C30B 25/12; Y10T 29/49; H01L 21/0262;
(Continued)

(56) References Cited

U.S. PATENT DOCUMENTS 3,656,454 A   4/1972   Schrader
3,754,110 A   8/1973   van Dongen et al.
(Continued)

FOREIGN PATENT DOCUMENTS

CN   1489644 A   4/2004
CN   106030761 A   10/2016
(Continued)

OTHER PUBLICATIONS

English Machine translation of Kim (KR-20130128815-A) retrieved from ESPACENET Nov. 3, 2020 (Year: 2020).*

(Continued)

*Primary Examiner* — Rakesh K Dhingra
*Assistant Examiner* — Laureen Chan
(74) *Attorney, Agent, or Firm* — Patterson Thuente Pedersen, P.A.

(57) ABSTRACT

A wafer carrier for use in a chemical vapor deposition (CVD) system includes a plurality of wafer retention pockets, each having a peripheral wall surface surrounding a floor surface and defining a periphery of that wafer retention pocket. Each wafer retention pocket has a periphery with a shape defined by at least a first arc having a first radius of curvature situated around a first arc center and a second arc having a second radius of curvature situated around a second arc center. The second arc is different from the first arc, either by its radius of curvature, arc center, or both.

10 Claims, 7 Drawing Sheets

Related U.S. Application Data

(60) Provisional application No. 61/931,966, filed on Jan. 27, 2014.

(58) Field of Classification Search
CPC .............. H01L 21/205; H01L 21/67346; H01L 21/6773; H01L 21/68735; H01L 21/68771; H01J 37/32715
See application file for complete search history.

(56) References Cited

U.S. PATENT DOCUMENTS

| | | |
|---|---|---|
| 3,783,822 A | 1/1974 | Wollam |
| 3,892,940 A | 7/1975 | Bloem et al. |
| 3,980,561 A | 9/1976 | Miyagi et al. |
| 4,105,810 A | 8/1978 | Yamazaki et al. |
| 4,309,961 A | 1/1982 | Satoh |
| 4,318,889 A | 3/1982 | Schiller |
| 4,369,031 A | 1/1983 | Goldman et al. |
| 4,539,933 A | 9/1985 | Campbell et al. |
| 4,560,420 A | 12/1985 | Lord |
| 4,565,157 A | 1/1986 | Brors et al. |
| 4,580,522 A | 4/1986 | Fujioka et al. |
| 4,658,513 A | 4/1987 | Strattman |
| 4,690,098 A | 9/1987 | Mertens et al. |
| 4,736,705 A | 4/1988 | Weyburne |
| 4,747,368 A | 5/1988 | Brien et al. |
| 4,859,832 A | 8/1989 | Uehara et al. |
| 4,919,542 A | 4/1990 | Nulman et al. |
| 4,956,538 A | 9/1990 | Moslehi |
| 4,986,215 A | 1/1991 | Yamada et al. |
| 5,020,200 A | 6/1991 | Mimasaka et al. |
| 5,040,484 A | 8/1991 | Mears et al. |
| 5,046,909 A | 9/1991 | Murdoch |
| 5,061,084 A | 10/1991 | Thompson et al. |
| 5,063,031 A | 11/1991 | Sato |
| 5,074,017 A | 12/1991 | Toya et al. |
| 5,114,242 A | 5/1992 | Gat et al. |
| 5,119,540 A | 6/1992 | Kong et al. |
| 5,119,541 A | 6/1992 | Ohmi et al. |
| 5,154,730 A | 10/1992 | Hodos et al. |
| 5,155,652 A | 10/1992 | Logan et al. |
| 5,156,461 A | 10/1992 | Moslehi et al. |
| 5,173,336 A | 12/1992 | Kennedy |
| 5,226,383 A | 7/1993 | Bhat |
| 5,242,501 A | 9/1993 | McDiarmid |
| 5,271,084 A | 12/1993 | Vandenabeele et al. |
| 5,291,514 A | 3/1994 | Heitmann et al. |
| 5,294,778 A | 3/1994 | Carman et al. |
| 5,296,037 A | 3/1994 | Sato et al. |
| 5,305,417 A | 4/1994 | Najm et al. |
| 5,344,492 A | 9/1994 | Sato et al. |
| 5,346,513 A | 9/1994 | Taniguchi et al. |
| 5,368,648 A | 11/1994 | Sekizuka |
| 5,370,739 A | 12/1994 | Foster et al. |
| 5,372,652 A | 12/1994 | Srikrishnan et al. |
| 5,384,008 A | 1/1995 | Sinha et al. |
| 5,393,232 A | 2/1995 | Haines |
| 5,403,401 A | 4/1995 | Haafkens et al. |
| 5,407,485 A | 4/1995 | Takagi |
| 5,431,738 A | 7/1995 | Murakami et al. |
| 5,436,172 A | 7/1995 | Moslehi |
| 5,442,727 A | 8/1995 | Fiory |
| 5,443,648 A | 8/1995 | Ohkase |
| 5,444,815 A | 8/1995 | Lee et al. |
| 5,446,824 A | 8/1995 | Moslehi |
| 5,456,757 A | 10/1995 | Aruga et al. |
| 5,497,727 A | 3/1996 | Mayeda et al. |
| 5,514,439 A | 5/1996 | Sibley |
| 5,521,657 A | 5/1996 | Klopotek |
| 5,527,393 A | 6/1996 | Sato et al. |
| 5,532,190 A | 7/1996 | Goodyear et al. |
| 5,536,918 A | 7/1996 | Ohkase et al. |
| 5,551,983 A | 9/1996 | Shepard, Jr. et al. |
| 5,584,936 A | 12/1996 | Pickering et al. |
| 5,588,999 A | 12/1996 | Takahashi |
| 5,624,499 A | 4/1997 | Mizuno et al. |
| 5,624,590 A | 4/1997 | Fiory |
| 5,635,409 A | 6/1997 | Moslehi |
| 5,645,646 A | 7/1997 | Beinglass et al. |
| 5,660,472 A | 8/1997 | Peuse et al. |
| 5,670,210 A | 9/1997 | Mandal et al. |
| 5,683,518 A | 11/1997 | Moore et al. |
| 5,683,606 A | 11/1997 | Ushikoshi et al. |
| 5,683,759 A | 11/1997 | Shepard, Jr. et al. |
| 5,688,331 A | 11/1997 | Aruga et al. |
| 5,755,511 A | 5/1998 | Peuse et al. |
| 5,761,023 A | 6/1998 | Lue et al. |
| 5,782,979 A | 7/1998 | Kaneno et al. |
| 5,785,764 A * | 7/1998 | Hoshina ............... C30B 25/12 118/500 |
| 5,788,799 A | 8/1998 | Steger et al. |
| 5,790,750 A | 8/1998 | Anderson |
| 5,800,622 A | 9/1998 | Takemi et al. |
| 5,820,686 A | 10/1998 | Moore |
| 5,837,058 A | 11/1998 | Chen et al. |
| 5,843,234 A | 12/1998 | Finn et al. |
| 5,854,468 A | 12/1998 | Muka |
| 5,855,677 A | 1/1999 | Carlson et al. |
| 5,874,711 A | 2/1999 | Champetier et al. |
| 5,881,208 A | 3/1999 | Ling et al. |
| 5,888,303 A | 3/1999 | Dixon |
| 5,895,596 A | 4/1999 | Stoddard et al. |
| 5,909,355 A | 6/1999 | Parkhe |
| 5,928,427 A | 7/1999 | Hwang |
| 5,930,456 A | 7/1999 | Vosen |
| 5,942,038 A | 8/1999 | Mayeda et al. |
| 5,958,140 A | 9/1999 | Arami et al. |
| 5,964,942 A | 10/1999 | Tanabe et al. |
| 5,980,706 A | 11/1999 | Bieck et al. |
| 5,982,986 A | 11/1999 | Davenport |
| 6,001,183 A | 12/1999 | Gurary et al. |
| 6,026,764 A | 2/2000 | Hwang |
| 6,039,811 A | 3/2000 | Park et al. |
| 6,086,362 A | 7/2000 | White et al. |
| 6,086,680 A | 7/2000 | Foster et al. |
| 6,111,225 A | 8/2000 | Ohkase et al. |
| 6,113,705 A | 9/2000 | Ohashi et al. |
| 6,146,464 A | 11/2000 | Beinglass et al. |
| 6,146,646 A | 11/2000 | Yusuf |
| 6,184,498 B1 | 2/2001 | Kiyama |
| 6,192,827 B1 | 2/2001 | Welch et al. |
| 6,211,495 B1 | 4/2001 | Stoddard et al. |
| 6,225,601 B1 | 5/2001 | Beer et al. |
| 6,259,072 B1 | 7/2001 | Kinnard et al. |
| 6,280,581 B1 | 8/2001 | Cheng |
| 6,340,501 B1 | 1/2002 | Kamiyama et al. |
| 6,442,950 B1 | 9/2002 | Tung |
| 6,444,027 B1 | 9/2002 | Yang et al. |
| 6,454,865 B1 | 9/2002 | Goodman et al. |
| 6,480,286 B1 | 11/2002 | Kubo et al. |
| 6,492,625 B1 | 12/2002 | Boguslavskiy et al. |
| 6,495,010 B2 | 12/2002 | Sferlazzo |
| 6,506,252 B2 | 1/2003 | Boguslavskiy et al. |
| 6,510,172 B1 | 1/2003 | Miller |
| 6,511,539 B1 | 1/2003 | Raaijmakers |
| 6,652,650 B2 | 11/2003 | Yang et al. |
| 6,669,824 B2 | 12/2003 | Sferlazzo et al. |
| 6,669,988 B2 | 12/2003 | Daws et al. |
| 6,729,875 B2 | 5/2004 | Goodman |
| 6,812,157 B1 | 11/2004 | Gadgil |
| 6,837,940 B2 | 1/2005 | Komeno et al. |
| 6,902,623 B2 | 6/2005 | Gurary et al. |
| 7,094,522 B2 | 8/2006 | Itoh et al. |
| 7,122,844 B2 | 10/2006 | Nakamura et al. |
| 7,276,124 B2 | 10/2007 | Gurary et al. |
| 7,339,656 B2 | 3/2008 | Matsumoto et al. |
| 7,357,842 B2 | 4/2008 | Ishikawa et al. |
| 7,960,254 B2 | 6/2011 | Wada et al. |
| 8,021,487 B2 | 9/2011 | Boguslavskiy et al. |
| 8,092,599 B2 | 1/2012 | Sferlazzo et al. |
| 8,308,867 B2 | 11/2012 | Franken et al. |
| 8,311,788 B2 | 11/2012 | Hurley et al. |
| 8,366,830 B2 | 2/2013 | Nakamura et al. |

(56) References Cited

U.S. PATENT DOCUMENTS

| | | | |
|---|---|---|---|
| 8,372,204 B2 | 2/2013 | Nakamura et al. |
| 8,535,445 B2 | 9/2013 | Volf et al. |
| 8,562,746 B2 | 10/2013 | Gurary et al. |
| 8,603,248 B2 | 12/2013 | Gurary et al. |
| 8,928,892 B2 | 1/2015 | Meimoun |
| 9,627,239 B2 | 4/2017 | Daewon |
| 10,145,013 B2 | 12/2018 | Krishnan et al. |
| 2002/0069970 A1 | 6/2002 | Noorbakhsh et al. |
| 2002/0076490 A1 | 6/2002 | Chiang et al. |
| 2002/0106826 A1 | 8/2002 | Boguslavskiy et al. |
| 2002/0108571 A1 | 8/2002 | Black et al. |
| 2002/0127334 A1 | 9/2002 | Gurer et al. |
| 2002/0170673 A1 | 11/2002 | Tanguay |
| 2002/0176936 A1 | 11/2002 | Matsuyama |
| 2002/0185068 A1 | 12/2002 | Gurary et al. |
| 2003/0011771 A1 | 1/2003 | Moriyama |
| 2003/0017665 A1 | 1/2003 | Tamada et al. |
| 2003/0049580 A1 | 3/2003 | Goodman |
| 2003/0114016 A1* | 6/2003 | Tischler ............ H01L 21/68764 |
| | | | 438/758 |
| 2004/0053143 A1 | 3/2004 | Sandstrom |
| 2004/0130691 A1 | 7/2004 | Boonman et al. |
| 2004/0144309 A1 | 7/2004 | Yudovsky |
| 2004/0184031 A1 | 9/2004 | Vook et al. |
| 2004/0263862 A1 | 12/2004 | Amparan et al. |
| 2005/0100681 A1 | 5/2005 | Kobayashi et al. |
| 2005/0118450 A1 | 6/2005 | Fujii et al. |
| 2005/0241580 A1 | 11/2005 | Park et al. |
| 2006/0076108 A1 | 4/2006 | Holland et al. |
| 2006/0086460 A1 | 4/2006 | Kitamura et al. |
| 2006/0127575 A1 | 6/2006 | Matsuyama |
| 2007/0158583 A1 | 7/2007 | Cho |
| 2007/0186853 A1 | 8/2007 | Gurary et al. |
| 2007/0227441 A1 | 10/2007 | Narahara et al. |
| 2008/0166884 A1 | 7/2008 | Nelson et al. |
| 2009/0017190 A1 | 1/2009 | Sferlazzo et al. |
| 2009/0068849 A1 | 3/2009 | Endo et al. |
| 2009/0081366 A1 | 3/2009 | Kerr et al. |
| 2009/0081886 A1 | 3/2009 | Levy et al. |
| 2009/0130858 A1 | 5/2009 | Levy |
| 2009/0155028 A1 | 6/2009 | Boguslavskiy et al. |
| 2009/0217878 A1 | 9/2009 | Levy et al. |
| 2009/0280649 A1 | 11/2009 | Mayer et al. |
| 2009/0308319 A1 | 12/2009 | Cheng et al. |
| 2010/0020297 A1 | 1/2010 | Inatomi |
| 2010/0055318 A1* | 3/2010 | Volf ................... C23C 16/4583 |
| | | | 427/255.28 |
| 2010/0055320 A1 | 3/2010 | Honma |
| 2010/0170641 A1 | 7/2010 | Jorgensen |
| 2010/0231881 A1 | 9/2010 | Den Boef et al. |
| 2010/0285209 A1 | 11/2010 | Tateishi |
| 2011/0049779 A1 | 3/2011 | Egami et al. |
| 2011/0114022 A1 | 5/2011 | Boguslavskiy et al. |
| 2011/0206843 A1 | 8/2011 | Gurary et al. |
| 2011/0207299 A1 | 8/2011 | Sakurai |
| 2011/0265724 A1 | 11/2011 | Chiang |
| 2012/0024231 A1 | 2/2012 | Horino |
| 2012/0040097 A1 | 2/2012 | Volf et al. |
| 2012/0073502 A1 | 3/2012 | Volf et al. |
| 2012/0164347 A1 | 6/2012 | Rhee et al. |
| 2012/0171377 A1 | 7/2012 | Volf et al. |
| 2012/0307233 A1 | 12/2012 | Boguslavskiy et al. |
| 2013/0065403 A1 | 3/2013 | Paranjpe et al. |
| 2013/0081390 A1 | 4/2013 | Takahashi et al. |
| 2013/0084390 A1 | 4/2013 | Suzuki et al. |
| 2013/0252404 A1 | 9/2013 | Krishnan et al. |
| 2013/0276704 A1 | 10/2013 | Krishnan et al. |
| 2013/0276978 A1 | 10/2013 | Bluck et al. |
| 2013/0291798 A1 | 11/2013 | Lee et al. |
| 2014/0102372 A1* | 4/2014 | Chang .................... C23C 16/46 |
| | | | 118/725 |
| 2014/0233040 A1 | 8/2014 | Gergen et al. |
| 2014/0261187 A1 | 9/2014 | Krishnan et al. |
| 2015/0211148 A1 | 7/2015 | Krishnan et al. |
| 2016/0115623 A1* | 4/2016 | Ito ........................... C30B 25/12 |
| | | | 118/725 |
| 2016/0351426 A1 | 12/2016 | Daewon |

FOREIGN PATENT DOCUMENTS

| | | | |
|---|---|---|---|
| EP | 0795624 A1 | 9/1997 |
| EP | 1096549 A2 | 5/2001 |
| EP | 3100298 A1 | 12/2016 |
| JP | S58128724 A | 8/1983 |
| JP | S59-220917 A | 12/1984 |
| JP | 62-054929 A | 3/1987 |
| JP | S63-226025 A | 9/1988 |
| JP | H4110466 A | 4/1992 |
| JP | H04157162 A | 5/1992 |
| JP | H04171944 A | 6/1992 |
| JP | 05230673 A | 9/1993 |
| JP | 07070730 A | 3/1995 |
| JP | H 8-078347 A | 3/1996 |
| JP | 09134880 A | 5/1997 |
| JP | 10-087394 A | 4/1998 |
| JP | H10-167885 A | 6/1998 |
| JP | H10-167886 A | 6/1998 |
| JP | 03003250 A | 1/1999 |
| JP | H11-162698 A | 6/1999 |
| JP | 2002-057207 A | 2/2002 |
| JP | 2004-080001 A | 3/2004 |
| JP | 2004-128271 A | 4/2004 |
| JP | 2005-045213 A | 2/2005 |
| JP | 2006-013020 A | 1/2006 |
| JP | 2007-294942 A | 11/2007 |
| JP | 4061904 B2 | 3/2008 |
| JP | 2010-027881 A | 2/2010 |
| JP | 2011-165697 A | 8/2011 |
| JP | 2011-233865 A | 11/2011 |
| JP | 2012-501541 A | 1/2012 |
| JP | 2013-078826 A | 5/2013 |
| JP | 5233888 B2 | 7/2013 |
| JP | 2013-222948 A | 10/2013 |
| JP | 2013-541183 A | 11/2013 |
| JP | 2014-127612 A | 7/2014 |
| JP | 2017-510088 A | 4/2017 |
| KR | 20130128815 A | 11/2013 |
| KR | 20130128815 A * | 11/2013 |
| WO | WO 1999/18599 A2 | 4/1999 |
| WO | WO 2001/007691 A1 | 2/2001 |
| WO | WO 2010/024943 A2 | 3/2010 |
| WO | WO 2014/196323 A1 | 12/2014 |
| WO | WO 2015/112969 A1 | 7/2015 |

OTHER PUBLICATIONS

CN Application No. 201580006019.X, Notification of First Office Action, dated May 22, 2017, 3 pages.
CN Application No. 201580006019.X, Notification of Second Office Action, dated Jan. 2, 2018, 3 pages.
CN Application No. 201580006019.X, Third Office Action dated Sep. 4, 2018.
EP Application No. 15740002, Supplemental European Search Report, dated Aug. 2, 2017, 9 pages.
JP Application No. 2016-566865, Office Action dated Nov. 27, 2018, 6 pages.
PCT Application No. PCT/US2015/012884, International Preliminary Report on Patentability, dated Aug. 11, 2016, 5 pages.
PCT Application No. PCT/US2015/012884, Search Report & Written Opinion, dated Apr. 30, 2015, 6 pages.
TW Application No. 104102501, Office Action dated Jun. 26, 2018, 9 pages.
Merriam-Webster Dictionary Definition of Arc, https://www.merriam-webster.com/dictionary/arc, Accessed/printed on Oct. 19, 2017 (year 2017).
Merriam-Webster Dictionary Definition of Radius of Curvature, https://www.merriam-webster.com/dictionary/radius%20of% curvature, Accessed/printed on Oct. 19, 2017 (year 2017).

(56) References Cited

OTHER PUBLICATIONS

Application and File History for U.S. Appl. No. 14/605,497, filed Jan. 26, 2015. Inventors: Krishnan et al.
CN Application No. 201580006019.X, Rejection Decision dated Feb. 2, 2019, 3 pages.

* cited by examiner

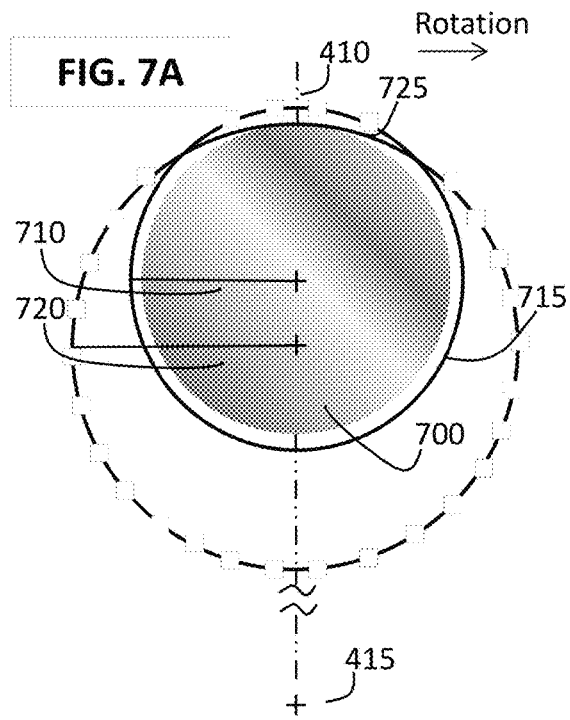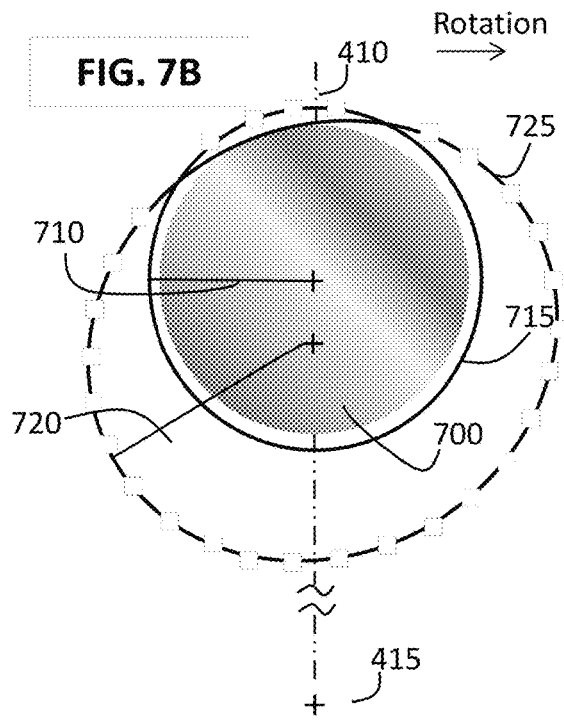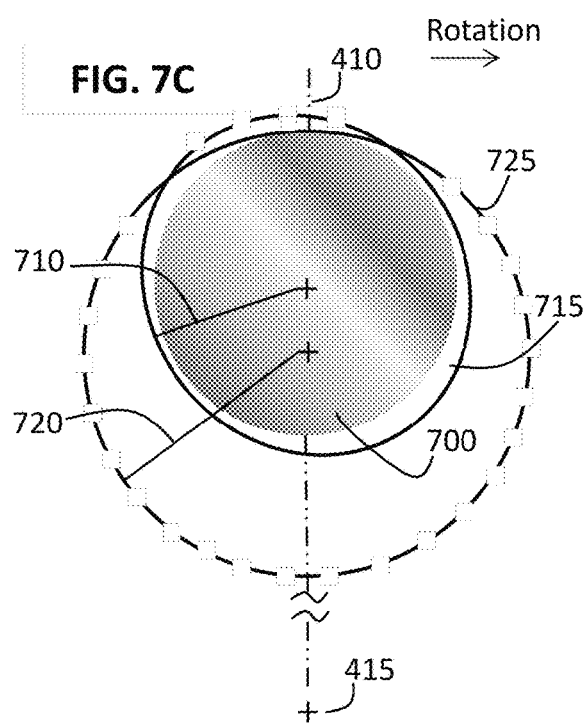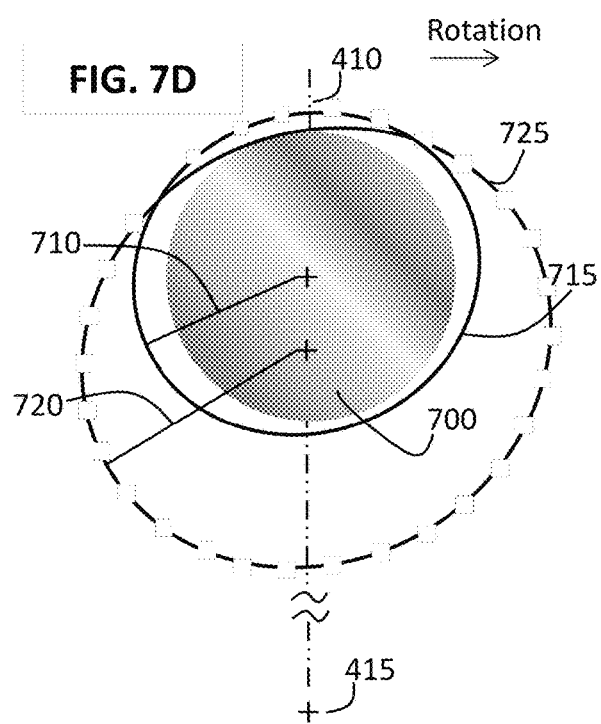

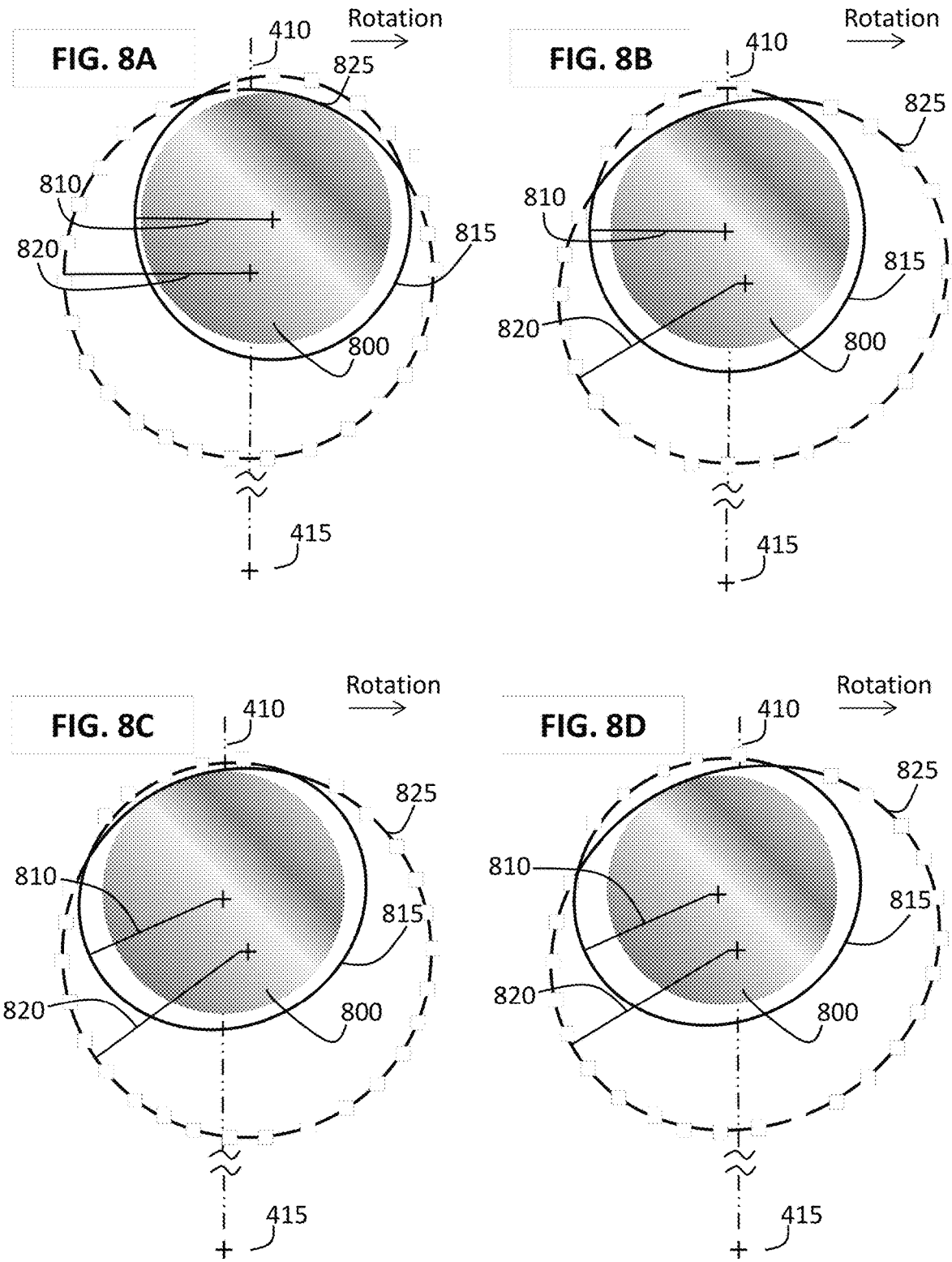

WAFER CARRIER HAVING RETENTION POCKETS WITH COMPOUND RADII FOR CHEMICAL VAPOR DEPOSITION SYSTEMS

PRIOR APPLICATION

This Application is a divisional of U.S. application Ser. No. 14/605,497, filed Jan. 26, 2015, now U.S. Pat. No. 10,145,013, which claims the benefit of U.S. Provisional Application No. 61/931,966 filed Jan. 27, 2014, which are hereby fully incorporated by reference herein.

FIELD OF THE INVENTION

The invention relates generally to semiconductor fabrication technology and, more particularly, to chemical vapor deposition (CVD) processing and associated apparatus having features for reducing temperature non-uniformities on semiconductor wafer surfaces during processing.

BACKGROUND OF THE INVENTION

In the fabrication of light-emitting diodes (LEDs) and other high-performance devices such as laser diodes, optical detectors, and field effect transistors, a chemical vapor deposition (CVD) process is typically used to grow a thin film stack structure using materials such as gallium nitride over a sapphire or silicon substrate. A CVD tool includes a process chamber, which is a sealed environment that allows infused gases to be deposited upon the substrate (typically in the form of wafers) to grow the thin film layers. An example of a current product line of such manufacturing equipment is the TurboDisc® family of MOCVD systems, manufactured by Veeco Instruments Inc. of Plainview, N.Y.

A number of process parameters are controlled, such as temperature, pressure and gas flow rate, to achieve a desired crystal growth. Different layers are grown using varying materials and process parameters. For example, devices formed from compound semiconductors such as III-V semiconductors typically are formed by growing successive layers of the compound semiconductor using metal organic chemical vapor deposition (MOCVD). In this process, the wafers are exposed to a combination of gases, typically including a metal organic compound as a source of a group III metal, and also including a source of a group V element which flow over the surface of the wafer while the wafer is maintained at an elevated temperature. Generally, the metal organic compound and group V source are combined with a carrier gas which does not participate appreciably in the reaction as, for example, nitrogen. One example of a III-V semiconductor is gallium nitride, which can be formed by reaction of an organo-gallium compound and ammonia on a substrate having a suitable crystal lattice spacing, as for example, a sapphire wafer. The wafer is usually maintained at a temperature on the order of 1000-1100° C. during deposition of gallium nitride and related compounds.

In a MOCVD process, where the growth of crystals occurs by chemical reaction on the surface of the substrate, the process parameters must be controlled with particular care to ensure that the chemical reaction proceeds under the required conditions. Even small variations in process conditions can adversely affect device quality and production yield. For instance, if a gallium and indium nitride layer is deposited, variations in wafer surface temperature will cause variations in the composition and bandgap of the deposited layer. Because indium has a relatively high vapor pressure, the deposited layer will have a lower proportion of indium and a greater bandgap in those regions of the wafer where the surface temperature is higher. If the deposited layer is an active, light-emitting layer of an LED structure, the emission wavelength of the LEDs formed from the wafer will also vary to an unacceptable degree.

In a MOCVD process chamber, semiconductor wafers on which layers of thin film are to be grown are placed on rapidly-rotating carousels, referred to as wafer carriers, to provide a uniform exposure of their surfaces to the atmosphere within the reactor chamber for the deposition of the semiconductor materials. Rotation speed is on the order of 1,000 RPM. The wafer carriers are typically machined out of a highly thermally conductive material such as graphite, and are often coated with a protective layer of a material such as silicon carbide. Each wafer carrier has a set of circular indentations, or pockets, in its top surface in which individual wafers are placed. Typically, the wafers are supported in spaced relationship to the bottom surface of each of the pockets to permit the flow of gas around the edges of the wafer. Some examples of pertinent technology are described in U.S. Patent Application Publication No. 2012/0040097, U.S. Pat. Nos. 8,092,599, 8,021,487, U.S. Patent Application Publication No. 2007/0186853, U.S. Pat. Nos. 6,902, 623, 6,506,252, and 6,492,625, the disclosures of which are incorporated by reference herein.

The wafer carrier is supported on a spindle within the reaction chamber so that the top surface of the wafer carrier having the exposed surfaces of the wafers faces upwardly toward a gas distribution device. While the spindle is rotated, the gas is directed downwardly onto the top surface of the wafer carrier and flows across the top surface toward the periphery of the wafer carrier. The used gas is evacuated from the reaction chamber through ports disposed below the wafer carrier. The wafer carrier is maintained at the desired elevated temperature by heating elements, typically electrical resistive heating elements disposed below the bottom surface of the wafer carrier. These heating elements are maintained at a temperature above the desired temperature of the wafer surfaces, whereas the gas distribution device typically is maintained at a temperature well below the desired reaction temperature so as to prevent premature reaction of the gases. Therefore, heat is transferred from the heating elements to the bottom surface of the wafer carrier and flows upwardly through the wafer carrier to the individual wafers.

The gas flow over the wafers varies depending on the radial position of each wafer, with outermost-positioned wafers being subjected to higher flow rates due to their faster velocity during rotation. Even each individual wafer can have temperature non-uniformities, i.e., cold spots and hot spots depending upon its geometrical position relative to the other wafers on the carrier. One of the variables affecting the formation of temperature non-uniformities is the shape of the pockets within the wafer carrier. Generally, pocket shapes are circular and have a single radius of curvature. As the wafer carrier rotates, the wafers are subject to substantial centripetal force at their outermost edge (i.e., the furthermost edge from the axis of rotation), causing the wafer to press against the interior wall of the respective pocket in the wafer carrier. Under this condition, there is no gas flow around these outer edges of the wafers, and there is increased heat conduction to these outer-most portions of the wafers, resulting in more temperature non-uniformity and further aggravating the problems described above. Efforts have been made to minimize the temperature non-uniformities by increasing the gap between the wafer's edge and the interior wall of the pocket, including designing a wafer that is flat on a portion of the edge (i.e., a "flat" wafer). This flat portion of the wafer creates a gap for gas to flow and decreases the points of contact with the interior wall of the pocket, thereby mitigating temperature non-uniformities.

A great deal of effort has been devoted to system design features to minimize temperature variations during processing; however, the problem continues to present many challenges. Given the extreme conditions wafers are subject to during chemical vapor deposition, including exposure to substantial centripetal force, there remains a need for improved technologies to further reduce temperature non-uniformities.

SUMMARY OF THE INVENTION

One aspect of the invention is directed to a wafer carrier for use in a system for growing epitaxial layers on one or more wafers by chemical vapor deposition (CVD). The wafer carrier includes a body formed symmetrically about a central axis, and including a generally planar top surface that is situated perpendicularly to the central axis. A plurality of wafer retention pockets are recessed in the body from the top surface, each of the wafer retention pockets including a floor surface generally parallel to the top surface, and a peripheral wall surface that surrounds the floor surface and defines a periphery of that wafer retention pocket. Each wafer retention pocket has a pocket center situated along a corresponding wafer carrier radial axis that is perpendicular to the central axis. Each wafer retention pocket has a periphery having a shape defined by at least a first arc having a first radius of curvature situated around a first arc center and a second arc having a second radius of curvature situated around a second arc center. The second arc is different from the first arc by at least one of: the first radius of curvature being different from the second radius of curvature, or the first arc center being different from the second arc center.

Advantageously, the use of wafer retention pockets shaped from compound arcs having different radii of curvature can provide improved uniformity in the thermal distribution on the surface of a wafer subjected to a CVD process. A number of other advantages will become apparent from the following Detailed Description.

BRIEF DESCRIPTION OF THE DRAWINGS

The invention may be more completely understood in consideration of the following detailed description of various embodiments of the invention in connection with the accompanying drawings, in which:

FIGS. 7A-7D are diagrams of wafers situated in pockets shaped from compound radii of two arcs, according to embodiments of the invention.

FIGS. 8A-8D are diagrams of wafers situated in pockets shaped from compound radii of two arcs, according to embodiments of the invention.

Figure 1:
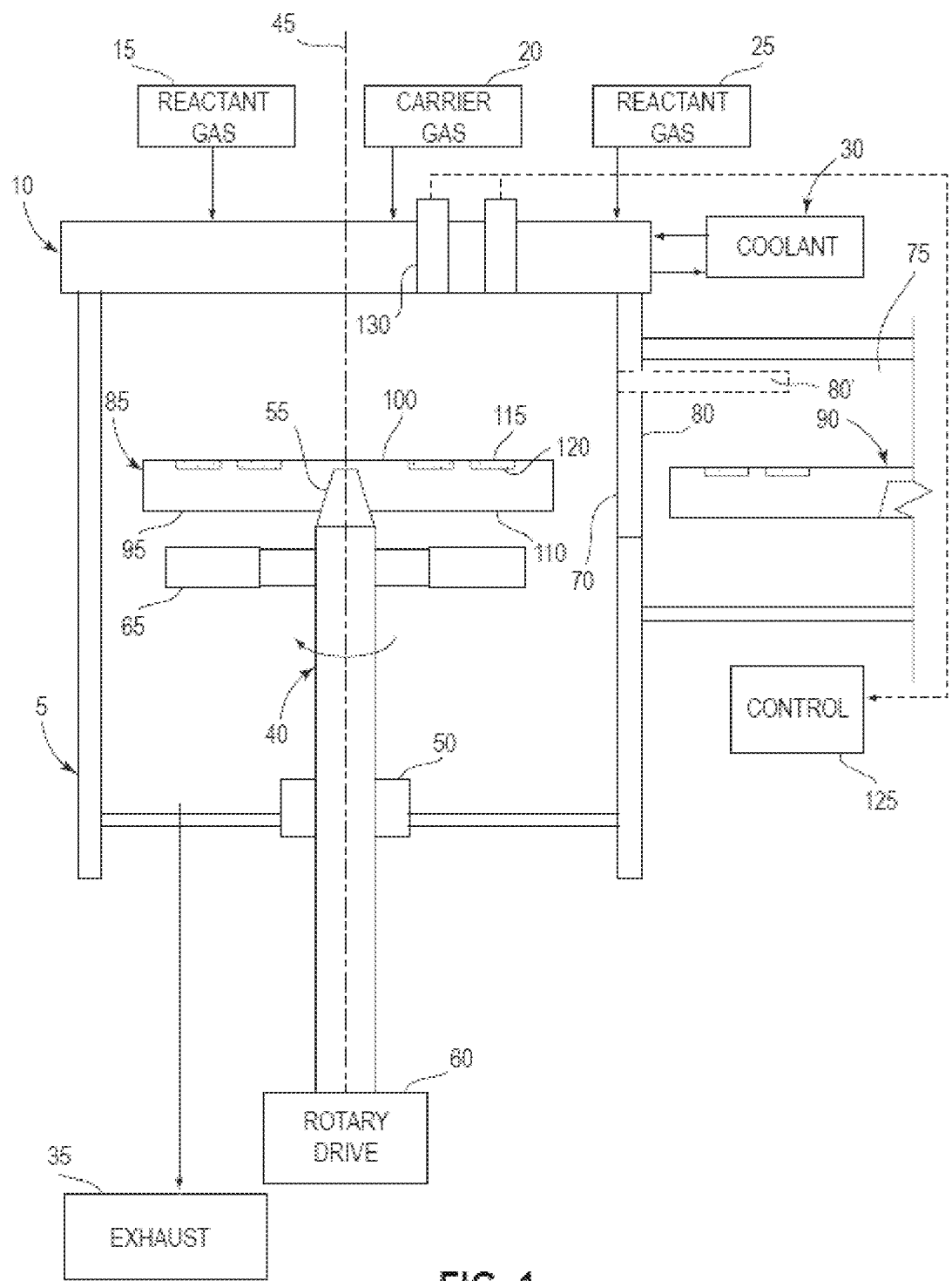
FIG. 1 illustrates a chemical vapor deposition apparatus in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

FIG. 1 illustrates a chemical vapor deposition apparatus in accordance with one embodiment of the invention. Reaction chamber 5 defines a process environment space. Gas distribution device 10 is arranged at one end of the chamber. The end having gas distribution device 10 is referred to herein as the "top" end of reaction chamber 5. This end of the chamber typically, but not necessarily, is disposed at the top of the chamber in the normal gravitational frame of reference. Thus, the downward direction as used herein refers to the direction away from gas distribution device 10; whereas the upward direction refers to the direction within the chamber, toward gas distribution device 10, regardless of whether these directions are aligned with the gravitational upward and downward directions. Similarly, the "top" and "bottom" surfaces of elements are described herein with reference to the frame of reference of reaction chamber 5 and gas distribution device 10.

Gas distribution device 10 is connected to sources 15, 20, and 25 for supplying process gases to be used in the wafer treatment process, such as a carrier gas and reactant gases, such as a metalorganic compound and a source of a group V metal. Gas distribution device 10 is arranged to receive the various gases and direct a flow of process gasses generally in the downward direction. Gas distribution device 10 desirably is also connected to coolant system 30 arranged to circulate a liquid through gas distribution device 10 so as to maintain the temperature of the gas distribution device at a desired temperature during operation. A similar coolant arrangement (not shown) can be provided for cooling the walls of reaction chamber 5. Reaction chamber 5 is also equipped with exhaust system 35 arranged to remove spent gases from the interior of the chamber through ports (not shown) at or near the bottom of the chamber so as to permit continuous flow of gas in the downward direction from gas distribution device 10.

Spindle 40 is arranged within the chamber so that the central axis 45 of spindle 40 extends in the upward and downward directions. Spindle 40 is mounted to the chamber by a conventional rotary pass-through device 50 incorporating bearings and seals (not shown) so that spindle 40 can rotate about central axis 45, while maintaining a seal between spindle 40 and the wall of reaction chamber 5. The spindle has fitting 55 at its top end, i.e., at the end of the spindle closest to gas distribution device 10. As further discussed below, fitting 55 is an example of a wafer carrier retention mechanism adapted to releasably engage a wafer carrier. In the particular embodiment depicted, fitting 55 is a generally frustoconical element tapering toward the top end of the spindle and terminating at a flat top surface. A frustoconical element is an element having the shape of a frustum of a cone. Spindle 40 is connected to rotary drive mechanism 60 such as an electric motor drive, which is arranged to rotate spindle 40 about central axis 45.

Heating element 65 is mounted within the chamber and surrounds spindle 40 below fitting 55. Reaction chamber 5 is also provided with entry opening 70 leading to antechamber 75, and door 80 for closing and opening the entry opening. Door 80 is depicted only schematically in FIG. 1, and is shown as movable between the closed position shown in solid lines, in which the door isolates the interior of reaction chamber 5 from antechamber 75, and an open position shown in broken lines at 80'. The door 80 is equipped with an appropriate control and actuation mechanism for moving it between the open position and closed positions. In practice, the door may include a shutter movable in the upward and downward directions as disclosed, for example, in U.S. Pat. No. 7,276,124, the disclosure of which is hereby incorporated by reference herein. The apparatus depicted in FIG. 1 may further include a loading mechanism (not shown) capable of moving a wafer carrier from the antechamber 75 into the chamber and engaging the wafer carrier with spindle 40 in the operative condition, and also capable of moving a wafer carrier off of spindle 40 and into antechamber 75.

The apparatus also includes a plurality of wafer carriers. In the operating condition shown in FIG. 1, a first wafer carrier 85 is disposed inside reaction chamber 5 in an operative position, whereas a second wafer carrier 90 is disposed within antechamber 75. Each wafer carrier includes body 95 which is substantially in the form of a circular disc having a central axis (See FIG. 2). Body 95 is formed symmetrically about central axis. In the operative position, the central axis of the wafer carrier body is coincident with central axis 45 of spindle 40. Body 95 may be formed as a single piece or as a composite of plural pieces. For example, as disclosed in U.S. Patent Application Pub. No. 20090155028, the disclosure of which is hereby incorporated by reference herein, the wafer carrier body may include a hub defining a small region of the body surrounding the central axis and a larger portion defining the remainder of the disc-like body. Body 95 is desirably formed from materials which do not contaminate the process and which can withstand the temperatures encountered in the process. For example, the larger portion of the disc may be formed largely or entirely from materials such as graphite, silicon carbide, or other refractory materials. Body 95 generally has a planar top surface 100 and a bottom surface 110 extending generally parallel to one another and generally perpendicular to the central axis of the disc. Body 95 also has one, or a plurality, of wafer-holding features adapted to hold a plurality of wafers.

Figure 2:
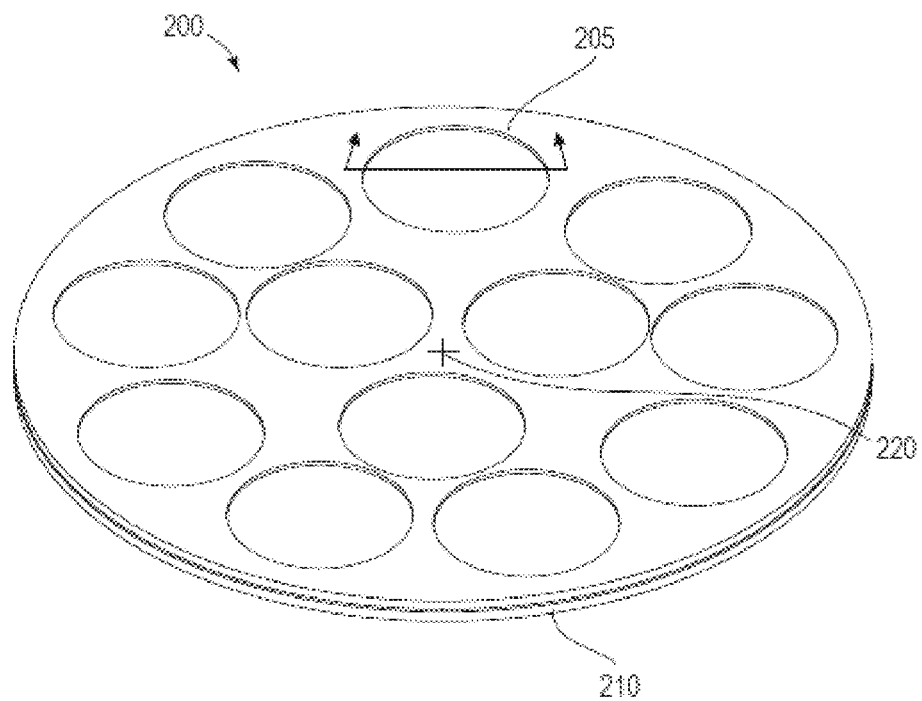
FIG. 2 is a perspective view diagram illustrating a wafer carrier used with a CVD system, according to one embodiment of the invention.

In operation, wafer 115, such as a disc-like wafer formed from sapphire, silicon carbide, or other crystalline substrate, is disposed within each pocket 120 of each wafer carrier. Typically, wafer 115 has a thickness which is small in comparison to the dimensions of its major surfaces. For example, a circular wafer of about 2 inches (50 mm) in diameter may be about 430 µm thick or less. As illustrated in FIG. 1, wafer 115 is disposed with a top surface facing upwardly, so that the top surface is exposed at the top of the wafer carrier. It should be noted that in various embodiments, wafer carrier 85 carries different quantities of wafers. For instance, in one example embodiment, wafer carrier 85 can be adapted to hold six wafers. In another example embodiment, as shown in FIG. 2, the wafer carrier holds 12 wafers.

In a typical MOCVD process, wafer carrier 85 with wafers loaded thereon is loaded from antechamber 75 into reaction chamber 5 and placed in the operative position shown in FIG. 1. In this condition, the top surfaces of the wafers face upwardly, towards gas distribution device 10. Heating element 65 is actuated, and rotary drive mechanism 60 operates to turn spindle 40 and hence wafer carrier 85 around axis 45. Typically, spindle 40 is rotated at a rotational speed from about 50-1500 revolutions per minute. Process gas supply units 15, 20, and 25 are actuated to supply gases through gas distribution device 10. The gases pass downwardly toward wafer carrier 85, over top surface 100 of wafer carrier 85 and wafers 115, and downwardly around the periphery of the wafer carrier to the outlet and to exhaust system 50. Thus, the top surface of the wafer carrier and the top surfaces of wafer 115 are exposed to a process gas including a mixture of the various gases supplied by the various process gas supply units. Most typically, the process gas at the top surface is predominantly composed of the carrier gas supplied by carrier gas supply unit 20. In a typical chemical vapor deposition process, the carrier gas may be nitrogen, and hence the process gas at the top surface of the wafer carrier is predominantly composed of nitrogen with some amount of the reactive gas components.

Heating elements 65 transfer heat to the bottom surface 110 of wafer carrier 85, principally by radiant heat transfer. The heat applied to the bottom surface of wafer carrier 85 flows upwardly through the body 95 of the wafer carrier to the top surface 100 of the wafer carrier. Heat passing upwardly through the body also passes upwardly through gaps to the bottom surface of each wafer, and upwardly through the wafer to the top surface of wafer 115. Heat is radiated from the top surface 100 of wafer carrier 85 and from the top surfaces of the wafer to the colder elements of the process chamber as, for example, to the walls of the process chamber and to gas distribution device 10. Heat is also transferred from the top surface 100 of wafer carrier 85 and the top surfaces of the wafers to the process gas passing over these surfaces.

In the embodiment depicted, the system includes a number of features designed to determine uniformity of heating of the surfaces of each wafer 115. In this embodiment, temperature profiling system 125 receives temperature information that can include a temperature and temperature monitoring positional information from temperature monitor 130. In addition, temperature profiling system 125 receives wafer carrier positional information, which in one embodiment can come from rotary drive mechanism 60. With this information, temperature profiling system 125 constructs a temperature profile of the wafers 120 on wafer carrier 85. The temperature profile represents a thermal distribution on the surface of each of the wafers 120.

Figure 3:
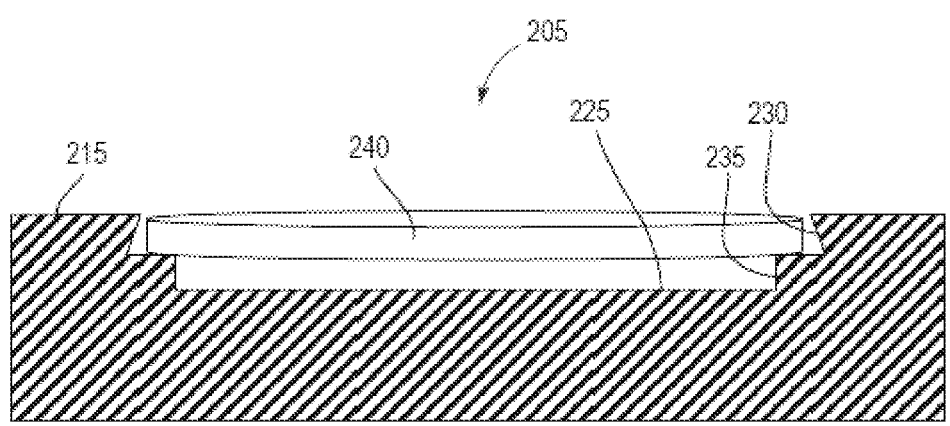
FIG. 3 is a diagram of a cross-sectional view taken along the line shown, detailing a wafer pocket used with a CVD system, according to one embodiment of the invention.

FIGS. 2 and 3 illustrate wafer carrier 200, also referred to as a susceptor, in greater detail. Each wafer retention site is in the form of a generally circular recess, or pocket 205, extending downwardly into body 210 from the top surface 215. FIG. 3 is a cross-sectional view of pocket 205 (demarcated with a horizontal line and two angled arrow in FIG. 2). The generally circular shape is made to correspond to the shape of wafer 240. Each wafer carrier 200 includes body 210 which is substantially in the form of a circular disc having a central axis 220. Body 210 is formed symmetrically about central axis 220. In the operative position, the central axis 220 of wafer carrier body 210 is coincident with the axis of the spindle (See FIG. 3). Body 210 may be formed as a single piece or as a composite of plural pieces. Each pocket 205 has a floor surface 225 disposed below the surrounding portions of top surface 215. Each pocket 205 also has a peripheral wall surface 230 surrounding floor surface 225 and defining the periphery of pocket 205. Peripheral wall surface 230 extends downwardly from the top surface 215 of body 210 to floor surface 225. In various embodiments, as depicted in particular in FIG. 3, peripheral wall surface 230 has an undercut where the wall slopes inwards, towards the center of the pocket, over at least a portion of the periphery. Thus, peripheral wall surface 230 forms an acute angle relative to floor surface 225. In one example embodiment, the angle formed between peripheral wall surface 230 and floor surface 225 is 80 degrees.

In a related embodiment (not shown), portions of peripheral wall surface 230 have varying degrees of sloping. For instance, in one such embodiment, those portions of peripheral wall surface 230 that are furthest from the central axis 220 of the wafer carrier have a more acute angle. In another related embodiment, as illustrated in FIG. 3, the floor surface 225 includes standoff features, such as tabs 235 located in certain locations along the periphery of each pocket 205. Tabs 235 raise the wafer 240 off of floor surface 225, thereby permitting some flow of gas around the edges and below the bottom surface of wafer 240. In other embodiments, wafer 240 can be raised from pocket floor surface 225 using a ring that fits inside pocket 205, just underneath peripheral wall surface 230; the ring can occupy the position of tabs 235 (i.e., in lieu of tabs), such that the outer periphery of wafer 240 rests on the ring.

Figure 4:
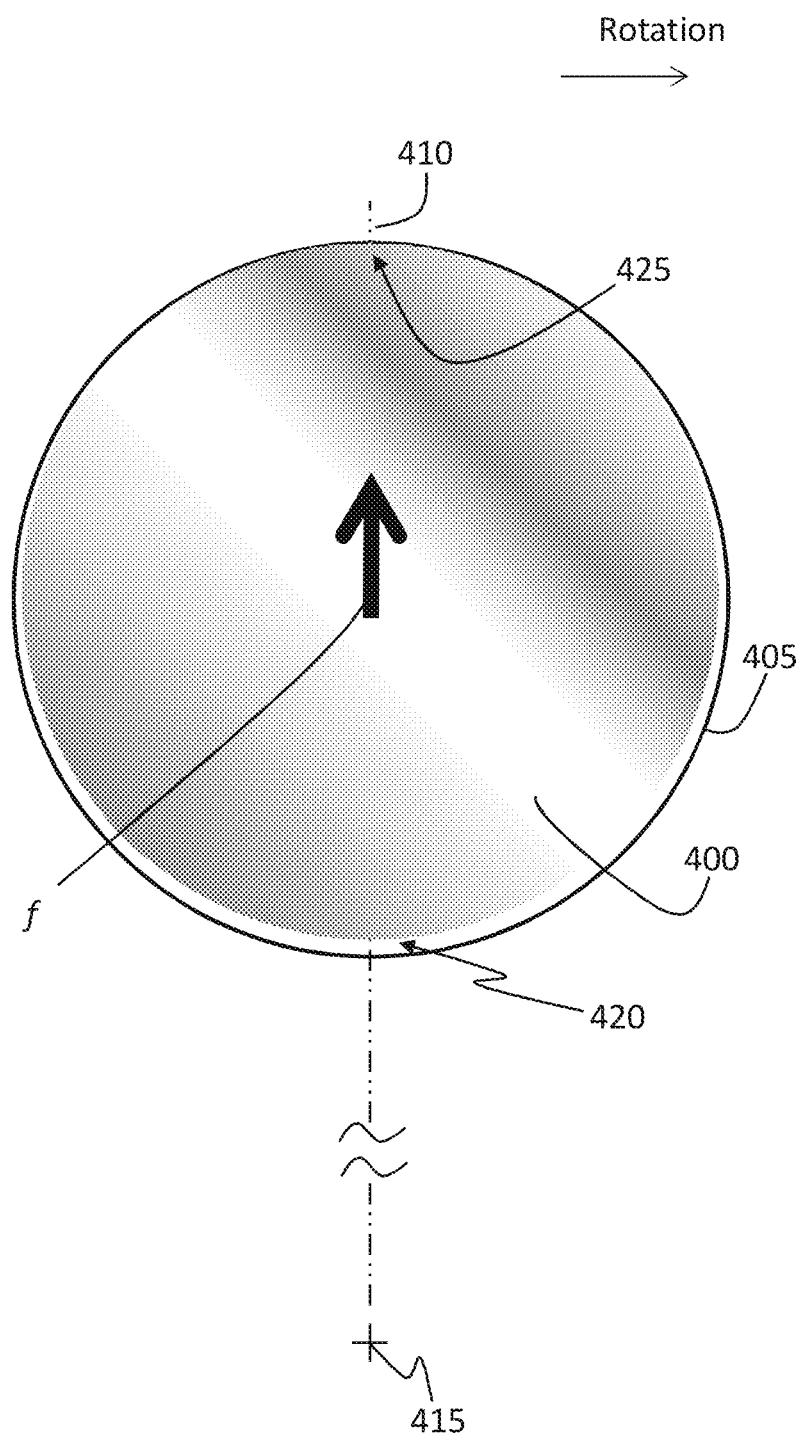
FIG. 4 is a diagram of a wafer situated in a conventional pocket, according to one embodiment of the invention.

FIG. 4 is a partial plan view diagram of wafer 400 situated in a pocket 405, while the wafer carrier is rotating in the direction of rotation shown. When a wafer carrier is rotating, each wafer 400 in its corresponding wafer pocket 405 exerts a reactive centrifugal force outwardly along its corresponding wafer carrier radial axis 410 in response to the centripetal force applied to the wafer by the outer-most portion of peripheral wall surface of pocket 405. The reactive centrifugal force is indicated with the arrow marked f that is pointing outwardly from central axis 415 along wafer carrier radial axis 410. As a result, an increased sized gap 420 is created on the interior portion, and the outer portion of wafer 400 presses against the interior wall of pocket 405. This situation creates temperature non-uniformities, with the outer portion being subjected generally to increased localized temperatures, i.e., hot spots.

Generally, the shapes of wafer pockets are circular, such that a wafer pocket has a single radius relative to the central axis of the pocket, as explained above in FIG. 4. However, in an effort to maintain a more uniform gap between a wafer and the peripheral wall of a wafer pocket to allow a more even distribution of gases during the CVD process, ultimately reducing temperature non-uniformities, wafer pockets can comprise different shapes. In various embodiments, a wafer pocket can be comprised of two or more arcs having different radii, such that the shape of the pocket can be elliptical or oval.

Figure 5:
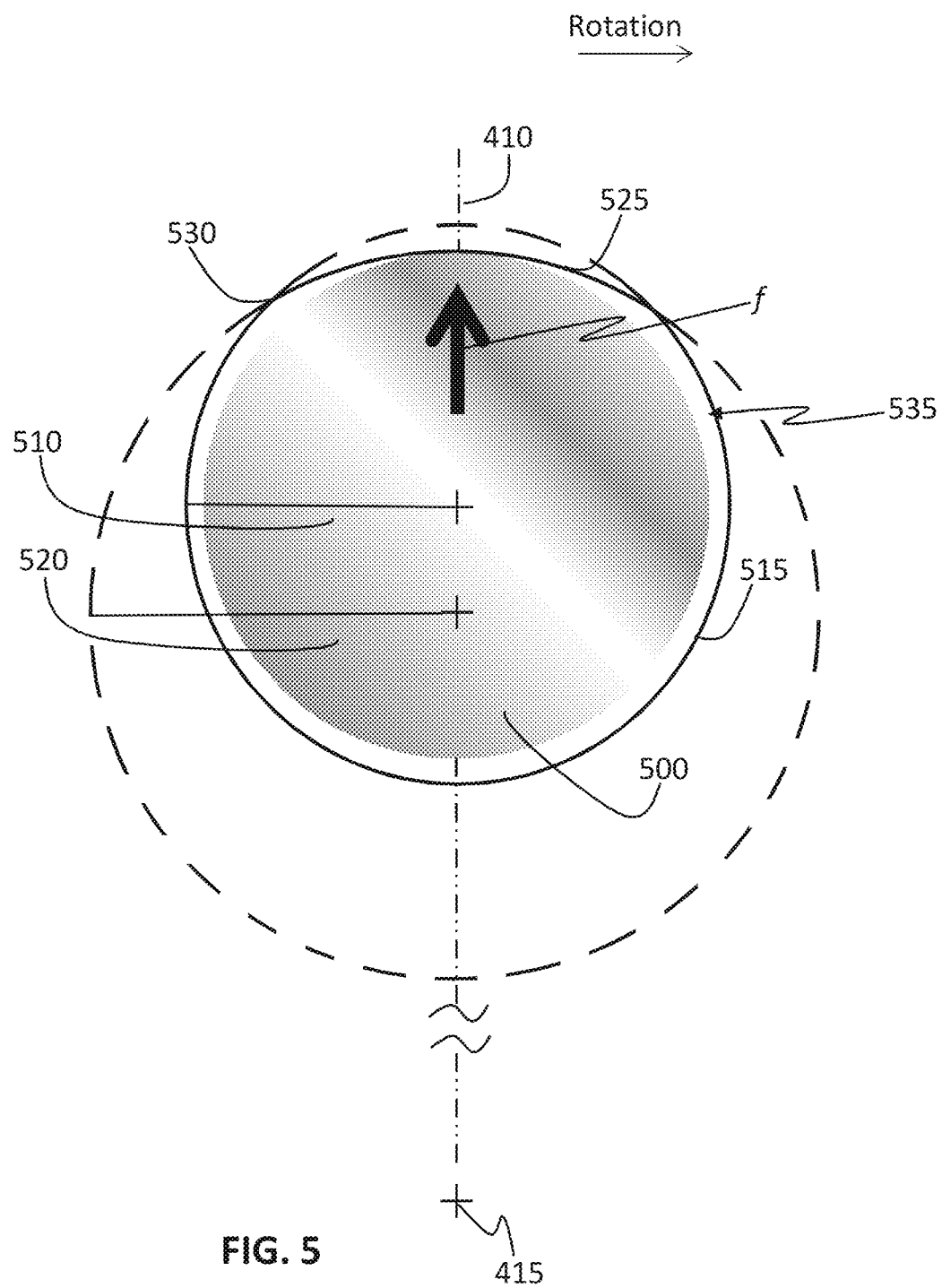
FIG. 5 is a diagram of a wafer situated in a pocket shaped from a compound radius of two intersecting arcs, according to one embodiment of the invention.

As illustrated in FIG. 5, wafer 500 is situated in a pocket shaped from a compound radius of two intersecting arcs according to one type of embodiment. The radius 510 of first arc 515 is smaller than radius 520 of second arc 525. First arc 515 and second arc 525 that together make up the periphery of the pocket are depicted in solid lines. For illustration purposes, these arcs are extended to form closed circles, with those portions not making up any part of the wafer pocket's periphery shown with dashed lines. First arc 515 intersects with second arc 525 at intersection point 530. In the embodiment depicted, each wafer pocket of the wafer carrier is shaped from a compound radius of two intersecting arcs. In related embodiments, three or more arcs having different radii may form the shape of the pocket's periphery.

According to these embodiments, such wafer pockets, can reduce the points of contact between a wafer and the interior portion of the wafer pocket against which the wafer presses (subject to centripetal force, or the reactive centrifugal force, during rotation of the wafer carrier, as depicted with arrow f), as described above. Additionally, using wafer pockets shaped as shown in FIG. 5 can increase gap 535 between the interior wall of the wafer pocket and the peripheral edge of the wafer, as well as make gap 535 more uniform, as compared to a wafer pocket having a single curvature. Advantageously, this ensures better gas flow and reduces the temperature non-uniformities affecting the wafer during CVD processing.

In one embodiment, the wafer pocket is shaped such that, when the wafer is situated in the pocket during processing, gap 535 is generally uniform in size over a majority of the pocket's circumference. In this context, the generally uniform size of the gap is defined as a gap size having a tolerance of +/−10%. In a related embodiment, gap 535 is generally uniform over at least 66% of the circumference of the wafer retention pocket. In still another related embodiment, gap 535 is generally uniform over at least 75% of the circumference of the wafer retention pocket. In a further embodiment, the radii are defined such that gap 535 is uniform over at least 85% of the circumference of the wafer retention pocket.

Figure 6:
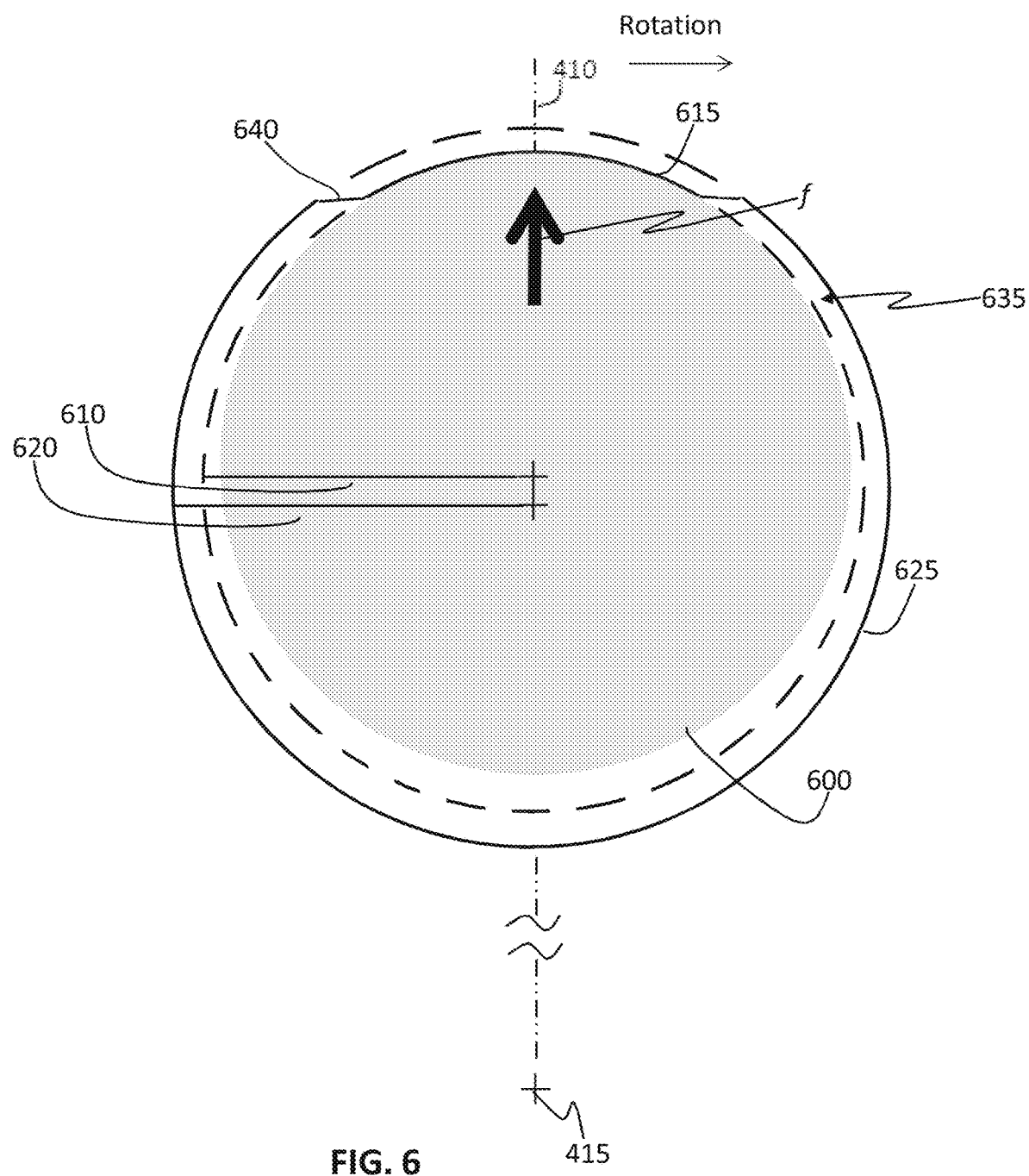
FIG. 6 is a diagram of a wafer situated in a pocket shaped from a compound radius of two non-intersecting arcs, according to one embodiment of the invention.

In other embodiments, a wafer pocket can be shaped from a compound radius, such that the arcs corresponding to those radii do not naturally intersect (i.e., no intersection point). As shown in FIG. 6, wafer 600 is situated in a pocket shaped from a compound radius of two non-intersecting arcs according to one embodiment. The radius 610 of first arc 615 is smaller than radius 620 of second arc 625; however, if extended to form closed circles (shown with dashed lines), first arc 615 would lie within second arc 625 and not intersect. In some embodiments, wafer pockets can be shaped from a compound radius of two or more non-intersecting arcs. In related embodiments, a wafer pocket shaped from a compound radius of two non-intersecting arcs includes connecting portions 640, symmetrically located on each side of the corresponding wafer carrier radial axis 410 of the wafer pocket, and near the distal end of the wafer pocket against which the wafer presses (exerting centrifugal force, shown with arrow), as described above. Connecting portions 640 complete the peripheral wall of the wafer pocket to connect first arc 615 and second arc 625.

As shown in FIG. 6, first arc 615 and second arc 625 form a wafer pocket having a compound radius in which the arcs corresponding to each radius do not intersect (shown with solid lines). Such wafer pockets, including the wafer pockets shaped as shown in FIG. 6, can reduce the points of contact between a wafer and the interior portion of the wafer pocket against which the wafer presses (exerting centrifugal force f), as described above. Additionally, using wafer pockets shaped as shown in FIG. 6 can increase gap 635 between the interior portion of the wafer pocket and the peripheral edge of the wafer, as well as make gap 635 more uniform, ultimately ensuring better gas flow and reducing the likelihood of forming temperature non-uniformities.

In one embodiment, the wafer pocket is shaped such that, when the wafer is situated in the pocket during processing, gap 635 is generally uniform in size over a majority of the pocket's circumference. In this context, the generally uniform size of the gap is defined as a gap size having a tolerance of +/−10%. In a related embodiment, gap 635 is generally uniform over at least 66% of the circumference of the wafer retention pocket. In still another related embodiment, gap 635 is generally uniform over at least 75% of the circumference of the wafer retention pocket. In a further embodiment, the radii are defined such that gap 635 is uniform over at least 85% of the circumference of the wafer retention pocket.

The embodiments above are intended to be illustrative and not limiting. Other variations are contemplated to fall within the claims. For example, in a related embodiment, on a given wafer carrier, different wafer retention pockets can have differing configurations of the compound radii defining the pockets. For example, in one embodiment, the ratio of the lengths of the first arc to the second arc can be different among wafer retention pockets that are situated closer to, or farther from, the center of the wafer carrier. For instance, the length of first arc 615 can be in smaller proportion to the length of second arc 625 for those pockets which are closer to the center of the wafer carrier. It is also contemplated that the opposite configuration (i.e., the first arc 615 being in larger proportion) for the pockets that are closer to the center, in certain other embodiments. Similar arrangements can be made for arcs 515 and 525 of the embodiment depicted in FIG. 5.

In another type of variation, the radii of the curvatures of the first and second arcs can vary from one wafer retention pocket to another on the same wafer carrier.

In still another type of variation, each of the first and second arcs 515 and 525, or 615 and 625, respectively, are situated symmetrically relative to wafer carrier radial axis 410. In another embodiment, the arcs may be situated asymmetrically to position the wafer somewhat off-center, which may further help mitigate heating non-uniformities in certain configurations. For example, as shown in FIGS. 7A-D, the centers of each of the first and second arcs can be situated such they both lie on the same wafer carrier radial axis 410. For illustration purposes, the arcs are extended to form closed circles, with those portions not making up any part of the wafer pocket's periphery shown with dashed lines. In some cases, first arc 715 and second arc 725 can also be symmetric with respect to the same wafer carrier radial axis 410, with radius 710 of first arc 715 being smaller than radius 720 of arc second 725 (FIG. 7A; see also, FIGS. 4-6). In other cases, first arc 715 can be symmetric with respect to wafer carrier radial axis 410, and second arc 725 can be asymmetric with respect to wafer carrier radial axis 410, with radius 710 of first arc 715 being smaller than radius 720 of second arc 725 (FIG. 7B). In other cases, first arc 715 can be asymmetric with respect to wafer carrier radial axis 410 and second arc 725 can be symmetric with respect to wafer carrier radial axis 410, with radius 710 of first arc 715 being smaller than radius 720 of arc second 725 (FIG. 7C). In still other cases, first arc 715 and second arc 725 can both be asymmetric with respect to wafer carrier radial axis 410, with radius 710 of first arc 715 being smaller than radius 720 of arc 725 (FIG. 7D).

Additionally, as shown in FIGS. 8A-D, the centers of each of the first and second arcs can be situated such they do not lie on the same wafer carrier radial axis. For illustration purposes, the arcs are extended to form closed circles, with those portions not making up any part of the wafer pocket's periphery shown with dashed lines. In some cases, first arc 815 and second arc 825 can be symmetric with respect to separate wafer carrier radial axes; for example, first arc 815 (with radius 810) can have a center that is not situated on wafer carrier radial axis 410, while second arc 825 (with radius 820) can have a center that is situated on wafer carrier radial axis 410 (FIG. 8A). In other cases, first arc 815 (with radius 810) can be symmetric with respect to wafer carrier radial axis 410 and have a center situated on wafer carrier radial axis 410, while second arc 825 (with radius 820) can be asymmetric with respect to wafer carrier radial axis 410 and have a center that is not situated on wafer carrier radial axis 410 (FIG. 8B). In other cases, first arc 815 (with radius 810) can be asymmetric with respect to wafer carrier radial axis 410 but have a center situated on wafer carrier radial axis 410, while second arc 825 (with radius 820) can be symmetric with respect to a separate wafer carrier axis (i.e., not wafer carrier radial axis 410) and have a center not situated on wafer carrier radial axis 410 (FIG. 8C). In still other cases, first arc 815 (with radius 810) and second arc 825 (with radius 820) can both be asymmetric with respect to separate wafer carrier axes (e.g., wafer carrier radial axis 410 and a separate wafer radial carrier axis) and both can have centers situated on separate radial axes (e.g., wafer carrier radial axis 410 and a separate wafer radial carrier axis) (FIG. 8D). These and other variations may help further mitigate temperature non-uniformities occurring on wafer 800.

In addition, although aspects of the present invention have been described with reference to particular embodiments, those skilled in the art will recognize that changes can be made in form and detail without departing from the scope of the invention, as defined by the claims. Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as will be understood by persons of ordinary skill in the art.

Any incorporation by reference of documents above is limited such that no subject matter is incorporated that is contrary to the explicit disclosure herein. Any incorporation by reference of documents above is further limited such that no claims that are included in the documents are incorporated by reference into the claims of the present application. The claims of any of the documents are, however, incorporated as part of the disclosure herein, unless specifically excluded. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A wafer carrier for use in a system for growing epitaxial layers on one or more wafers by chemical vapor deposition (CVD), the wafer carrier comprising:
   a body formed symmetrically about a central axis, and including a generally planar top surface that is perpendicular to the central axis;
   a plurality of wafer retention pockets recessed in the body from the top surface, each of the wafer retention pockets including:
      a floor surface generally parallel to the top surface; and a peripheral wall surface surrounding the floor surface and configured to receive a corresponding wafer, the peripheral wall surface defining a periphery of that wafer retention pocket at an intersection of the peripheral wall surface and the floor surface, wherein each wafer retention pocket has a pocket center situated along a corresponding wafer carrier radial axis that is perpendicular to the central axis; and the periphery of each wafer retention pocket having a shape defined by a first arc having a first radius of curvature situated around a first arc center, a second arc having a second radius of curvature situated around a second arc center, and two connecting portions symmetrically located on each side of the corresponding wafer carrier radial axis, and each connecting portion intersects with both the first arc and the second arc, wherein the second arc is different from the first arc by the first arc center being different from the second arc center, and wherein, if the first and second arcs are extended to form closed circles, the first arc would lie within the second arc and not intersect the second arc.

2. The wafer carrier of claim 1, wherein each wafer retention pocket has a proximal end and a distal end relative to the central axis, and in the periphery of each wafer retention pocket, the first arc is situated at the distal end and the second arc is situated at the proximal end;

wherein the first arc has a smaller radius of curvature than the second arc.

3. The wafer carrier of claim 1, wherein each wafer retention pocket has a proximal end and a distal end relative to the central axis, and in the periphery of each wafer retention pocket, the first arc is situated at the distal end and the second arc is situated at the proximal end;

wherein the first arc is situated symmetrically about the wafer carrier radial axis corresponding to the wafer retention pocket having the periphery defined by the first and the second arcs.

4. The wafer carrier of claim 1, wherein each wafer retention pocket has a proximal end and a distal end relative to the central axis, and in the periphery of each wafer retention pocket, the first arc is situated at the distal end and the second arc is situated at the proximal end;

wherein the second arc is situated symmetrically about the wafer carrier radial axis corresponding to the wafer retention pocket having the periphery defined by the first and the second arcs.

5. The wafer carrier of claim 1, wherein each wafer retention pocket has a proximal end and a distal end relative to the central axis, and in the periphery of each wafer retention pocket, the first arc is situated at the distal end and the second arc is situated at the proximal end;

wherein the first arc and the second arc are each situated symmetrically about the wafer carrier radial axis corresponding to the wafer retention pocket having the periphery defined by the first and the second arcs.

6. The wafer carrier of claim 1, further comprising:

a first wafer retention pocket and a second wafer retention pocket; and wherein a ratio between a length of the first arc to a length of the second arc of a common wafer retention pocket is different among the first wafer retention pocket and the second wafer retention pocket.

7. The wafer carrier of claim 1, further comprising:

a first wafer retention pocket and a second wafer retention pocket; and wherein a ratio between a radius of curvature of the first arc to a radius of curvature of the second arc of a common wafer retention pocket is different among the first wafer retention pocket and the second wafer retention pocket.

8. The wafer carrier of claim 1, wherein the peripheral wall surface of each wafer retention pocket is constructed such that, when the wafer is situated in the wafer retention pocket during CVD processing, a gap between an outer edge of the wafer and the peripheral wall surface of the wafer retention pocket is generally uniform in size around at least 50% of a circumference of the wafer.

9. The wafer carrier of claim 1, wherein the peripheral wall surface of each wafer retention pocket is constructed such that, when the wafer is situated in the wafer retention pocket during CVD processing, a gap between an outer edge of the wafer and the peripheral wall surface of the wafer retention pocket is generally uniform in size around at least 75% of a circumference of the wafer.

10. A method for constructing a wafer carrier for use in a system for growing epitaxial layers on one or more wafers by chemical vapor deposition (CVD), the method comprising:

forming a body symmetrically about a central axis to include a generally planar top surface that is perpendicular to the central axis;

forming a plurality of wafer retention pockets recessed in the body from the top surface, each of the wafer retention pockets including:

a floor surface generally parallel to the top surface; and a peripheral wall surface surrounding the floor surface and configured to receive a corresponding wafer, the peripheral wall surface defining a periphery of that wafer retention pocket at an intersection of the peripheral wall surface and the floor surface, wherein in forming the plurality of wafer retention pockets, each wafer retention pocket is formed to have a pocket center situated along a corresponding wafer carrier radial axis that is perpendicular to the central axis; and the periphery of each wafer retention pocket having a shape defined by a first arc having a first radius of curvature situated around a first arc center and a second arc having a second radius of curvature situated around a second arc center and two connecting portions symmetrically located on each side of the corresponding wafer carrier radial axis, and each connecting portion intersects with both the first arc and the second arc, wherein the second arc is different from the first arc by the first arc center being different from the second arc center and wherein, if the first and second arcs are extended to form closed circles, the first arc would lie within the second arc and not intersect the second arc.

* * * * *